United States Patent
Badger et al.

(10) Patent No.: US 8,437,967 B2
(45) Date of Patent: May 7, 2013

(54) METHOD AND SYSTEM FOR INSPECTING MULTI-LAYER RETICLES

(75) Inventors: Karen D. Badger, Georgia, VT (US); Karen Strube Edwards, Milton, VT (US); Patricia Mae Hynek, Jericho, VT (US); John M. Leonard, Essex Junction, VT (US); Maureen Fitzpatrick McFadden, Burlington, VT (US); David A. Merchant, Milton, VT (US)

(73) Assignee: International Business Machines Corporation, Armonk, NY (US)

(\*) Notice: Subject to any disclaimer, the term of this patent is extended or adjusted under 35 U.S.C. 154(b) by 544 days.

(21) Appl. No.: 12/694,359

(22) Filed: Jan. 27, 2010

(65) Prior Publication Data

US 2011/0184662 A1 Jul. 28, 2011

(51) Int. Cl.
*G01B 5/28* (2006.01)
*G06F 11/30* (2006.01)

(52) U.S. Cl.
USPC .............. 702/35; 702/117; 702/182; 702/183

(58) Field of Classification Search ................. 702/117, 702/182–186, 34–36
See application file for complete search history.

(56) References Cited

U.S. PATENT DOCUMENTS

| | | | |
|---|---|---|---|
| 6,282,309 B1 | 8/2001 | Emery et al. | |
| 6,482,557 B1 | 11/2002 | Chen et al. | |
| 7,945,873 B2 * | 5/2011 | Watanabe et al. | 716/55 |
| 2002/0022311 A1 * | 2/2002 | Takeuchi et al. | 438/200 |
| 2003/0202181 A1 * | 10/2003 | Maltabes et al. | 356/401 |

\* cited by examiner

*Primary Examiner* — Phuong Huynh
(74) *Attorney, Agent, or Firm* — Schmeiser, Olsen & Watts; Richard Kotulak

(57) ABSTRACT

A method of and system for inspecting multi-layer reticles. The method includes: selecting a multi-layer reticle having an array of cells arranged in R rows and C columns; defining a full inspection region that includes all cells of the array of cells; and when R is equal to one (or is greater than two) and C greater than two (or is equal to one) and a cell of the array of cells is a dummy cell in a first or last position of a row (or of a column) of the array of cells, then reducing the full inspection region to generate a shrunken inspection region that does not include the dummy cell, and then inspecting the shrunken inspection region for defects. If the dummy cell is between two non-dummy cells, then the dummy cell is a copy of one of the non-dummy cells, but is not inspected.

25 Claims, 8 Drawing Sheets

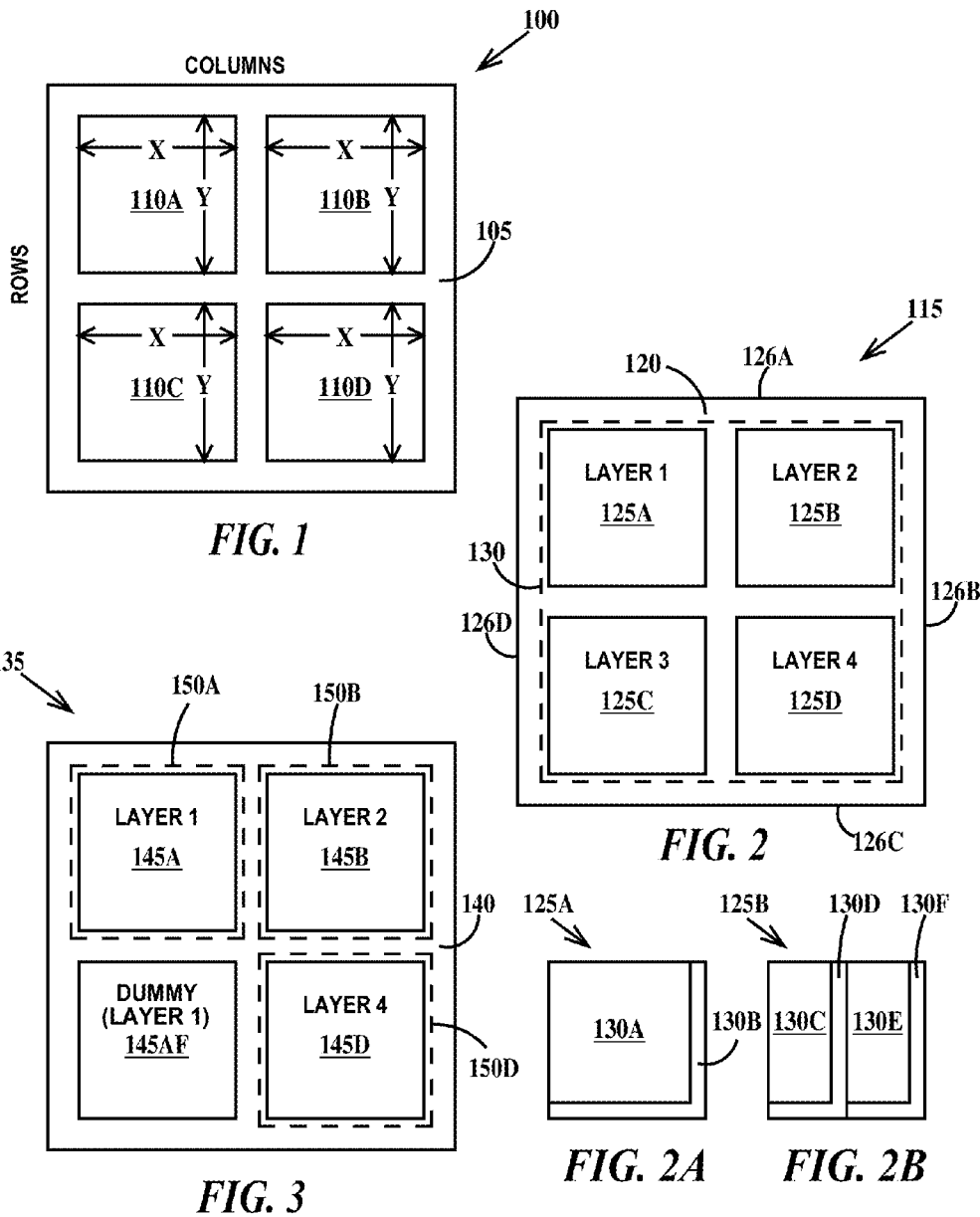

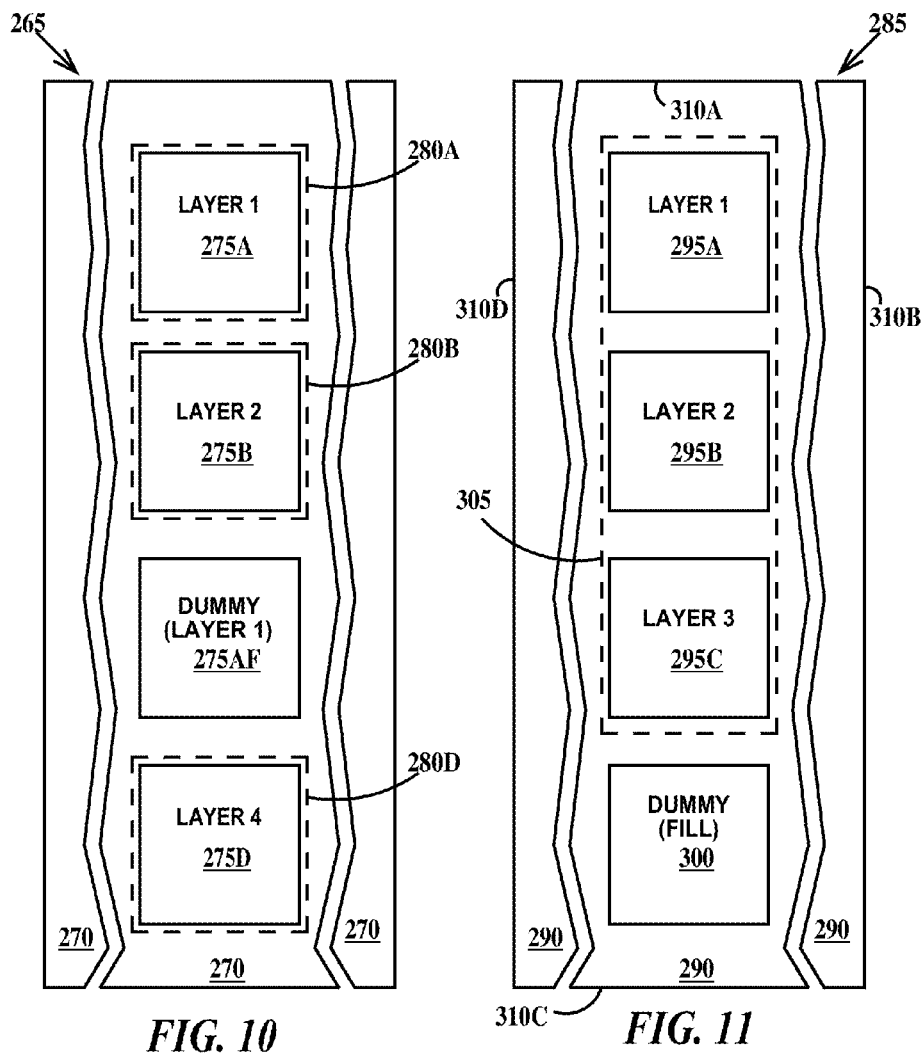
*FIG. 10*  *FIG. 11*
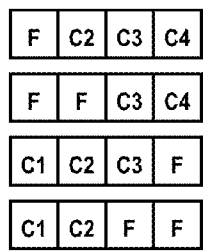
*FIG. 7A*
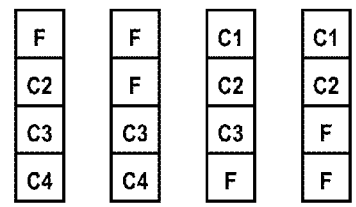
*FIG. 11A*

METHOD AND SYSTEM FOR INSPECTING MULTI-LAYER RETICLES

FIELD OF THE INVENTION

The present invention relates to the field of multi-layer masks for integrated circuit manufacture; more specifically, it relates to a method and system for inspecting multi-layer reticles.

BACKGROUND

Multi-layer reticles are photomasks having multiple cells that used to define different physical layers and/or structures of an integrated circuit. Fabrication of multi-layer reticles requires preparation of datasets describing the reticles, fabrication of the reticles and inspection of the reticles. While the fabrication of multi-layer reticles can reduce mask fabrication costs compared to single-layer reticles where all cells are the same, the logistics requirements and inspections of multi-layer reticles can actually increase costs. Accordingly, there exists a need in the art to mitigate the deficiencies and limitations described hereinabove.

SUMMARY

A first aspect of the present invention is a method, comprising: selecting a multi-layer reticle having an array of cells arranged in R rows and C columns; defining a full inspection region that includes all cells of the array of cells; when R is equal to one and C is an integer equal to or greater than two and a cell of the array of cells is a dummy cell that does not define a layer of an integrated circuit chip and the dummy cell is in a first or last position of a row of the array of cells or when C is equal to one and R is an integer equal to or greater than two and a cell of the array of cells is a dummy cell that does not define a layer of an integrated circuit chip and the dummy cell is not in a top or bottom position of a column of the array of cells, then reducing the full inspection region to generate a shrunken inspection region that does not include the dummy cell; and inspecting the shrunken inspection region for defects.

A second aspect of the present invention is a method comprising: selecting a multi-layer reticle having an array of cells arranged in R rows and C columns; defining a full inspection region that includes all cells of the array of cells; determining the value of R and C; and if all cells of the all cells of the array of cells define different layers of an integrated circuit, then inspecting the full inspection region for defects; or if at least one cell of the array of cells is a dummy cell either does not define a layer of the integrated circuit or is a copy of another cell of the array of cells and both R and C are independently equal to or greater than two, then generating do-inspect regions for each cell of the array that is not a dummy cell and inspecting the do-inspect regions for defects; or if at least one cell of the array of cells is a dummy cell that either does not define a layer of the integrated circuit or is a copy of another cell of the array of cells and either R or C but not both are equal to one, then generating do-inspect regions for each cell of the array that is not a dummy cell and inspecting the do-inspect regions or generating a shrunken inspection region that includes all cells of the array or cells that are not dummy cells for defects.

A third aspect of the present invention is a computer system, comprising a processor, an address/data bus coupled to the processor, and a computer-readable memory unit coupled to communicate with the processor, the memory unit containing instructions that when executed by the processor implement a method of generating an inspection recipe file, the method comprising the computer implemented steps of: based on records in a database describing a design of a multi-layer reticle having an array of cells arranged in R rows and C columns, defining a full inspection region that includes all cells of the array of cells; when R is equal to one and C is an integer equal to or greater than two and a cell of the array of cells is a dummy cell that does not define a layer of an integrated circuit chip and the dummy cell is in a first or last position of a row of the array of cells or when C is equal to one and R is an integer equal to or greater than two and a cell of the array of cells is a dummy cell that does not define a layer of an integrated circuit chip and the dummy cell is not in a top or bottom position of a column of the array of cells, then reducing the full inspection region to generate a shrunken inspection region that does not include the dummy cell; and generating the inspection recipe file useable by the mask defect inspection tool, the inspection recipe file including instructions for inspecting the shrunken inspection region for defects.

A fourth aspect of the present invention is a computer system, comprising a processor, an address/data bus coupled to the processor, and a computer-readable memory unit coupled to communicate with the processor, the memory unit containing instructions that when executed by the processor implement a method of generating an inspection recipe file, the method comprising the computer implemented steps of: based on records in a database describing a design of a multi-layer reticle having an array of cells arranged in R rows and C columns, selecting a multi-layer reticle having an array of cells arranged in R rows and C columns; defining a full inspection region that includes all cells of the array of cells; determining the value of R and C; and if all cells of the all cells of the array of cells define different layers of an integrated circuit, then inspecting the full inspection region for defects; or if at least one cell of the array of cells is a dummy cell either does not define a layer of the integrated circuit or is a copy of another cell of the array of cells and both R and C are independently equal to or greater than two, then generating do-inspect regions for each cell of the array that is not a dummy cell and inspecting the do-inspect regions for defects; or if at least one cell of the array of cells is a dummy cell that either does not define a layer of the integrated circuit or is a copy of another cell of the array of cells and either R or C but not both are equal to one, then generating do-inspect regions for each cell of the array that is not a dummy cell and inspecting the do-inspect regions or generating a shrunken inspection region that includes all cells of the array or cells that are not dummy cells for defects.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 1 is a plan view of an exemplary two dimensional multi-layer reticle layout according to the present invention;

FIG. 2 is a top view of a first exemplary a multi-layer reticle using the two dimensional multi-layer reticle layout of FIG. 1 according to an embodiment of the present invention;

FIGS. 2A and 2B are top views of exemplary reticle cells according to embodiments of the present invention;

FIG. 3 is a top view of a second exemplary a multi-layer reticle using the two dimensional multi-layer reticle layout of FIG. 1 according to an embodiment of the present invention;

FIG. 7A illustrates alternative cell and opaque fill cell combinations from that illustrated in FIG. 7;

FIG. 10 is a top view of a second exemplary a multi-layer reticle using the one dimensional multi-layer reticle layout of FIG. 8 according to an embodiment of the present invention;

FIG. 11 is a top view of a third exemplary a multi-layer reticle using the one dimensional multi-layer reticle layout of FIG. 8 according to an embodiment of the present invention;

FIG. 11A illustrates alternative cell and opaque fill cell combinations from that illustrated in FIG. 11;

DETAILED DESCRIPTION

Figure 4:
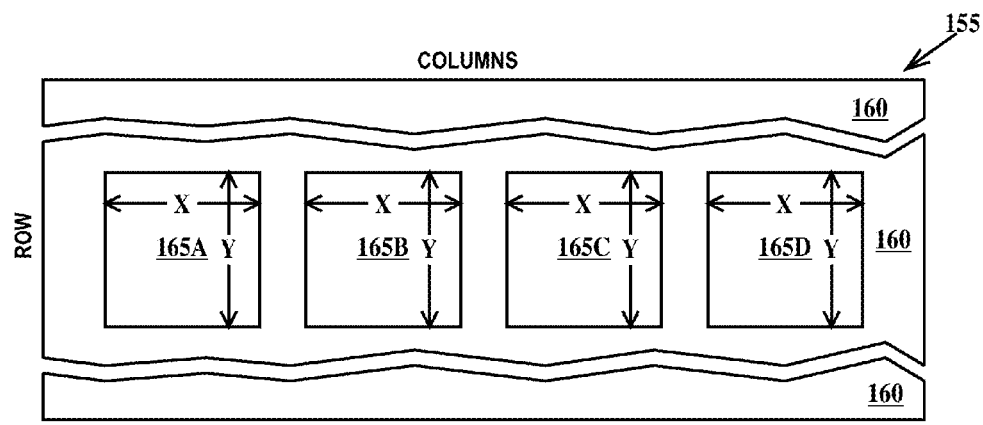
FIG. 4 is a plan view of a first exemplary one dimensional multi-layer reticle layout according to the present invention.

The present invention is applicable to a type of photomask known as a multi-layer reticle. Reticles contain the pattern of less integrated circuit chips then are on the wafer to be fabricated and are printed multiple times on a wafer to form all the integrated circuit chips on the wafer. Multi-layer reticles contain the patterns of different layers of the integrated circuit chip to be manufactured, but again the number of instances of each pattern is less than the number of integrated circuit chips on the wafer, so each pattern is printed multiple times on a wafer to form all the integrated circuit chips on the wafer.

The present invention is applicable to conventional photomasks are fabricated from a transparent substrate, for example glass, quartz, or other materials on which an opaque layer has been formed, for example a layer of chrome on glass (COG) or a dual layer of chrome over molybdenum on glass. The present invention is also applicable to phase shift masks (PSM) in which trenches have been formed into the substrate to thin the substrate immediately adjacent to the edges of opaque features. The present invention is further applicable to another type of phase shift mask known as a "chromeless" mask having no "opaque" coating but rather regions of the substrate with zero radian phase shifts and regions of π or −π in phase shifts. It should be understood that the phase shift of a layer is a function of thickness and that the intensity of electromagnetic radiation passing through a layer is proportional to the second power of the phase (in radians). Other types of phase shift masks are known.

For conventional photomasks, clear regions are formed by removal of the opaque layer by a photolithographic process. In one example, a photoresist layer is applied to mask blank (a clear substrate having a continuous opaque layer), a pattern is exposed into the photoresist by a mask-writing tool, such as an electron beam tool driven by a dataset, the photoresist developed, the opaque layer etched away (for example by a reactive ion etch process) where it is exposed by the development process and then the remaining photoresist layer removed leaving a patterned region which comprises opaque sub-regions and clear areas sub-regions.

For phase shift, or other advanced types of masks, an additional photolithographic process may be used form the notches in the substrate. For "chromeless" phase shift masks a single photolithographic process may be used form a pattern of thin and thick regions in the substrate.

A positive photoresist is a photoresist that is de-polymerized when exposed to light of the proper wavelength. A negative is a photoresist that is de-polymerized when exposed to light of the proper wavelength. It should be understood that the terms "transparent substrate" and "clear region" mean light of the wavelength used by the exposure tool using the photomask in a integrated circuit chip manufacturing line will pass through the transport substrate or clear region un-attenuated to the degree that a positive photoresist layer on a wafer in the exposure tool will be exposed sufficiently to be removed by a chemical development process and a negative photoresist layer on a wafer in the exposure tool will be exposed sufficiently not to be removed by a chemical development process. It should be understood that the term "opaque region" means light of the wavelength used by the exposure tool using the photomask in a integrated circuit chip manufacturing line will be attenuate or completely blocked to the degree that a positive photoresist layer on a wafer in the exposure tool will not be exposed sufficiently to be removed by the development process or a negative photoresist will be exposed sufficiently not to be removed by the development process. By these definitions all photomasks have clear and opaque regions.

After fabrication the photomasks are inspected for defects and optionally any defects found repaired.

It should be further understood, that a photomask contains a chip region comprising an active region and a kerf region. The active region is comprised of a pattern of opaque and clear sub-regions corresponding to features of an integrated circuit chip (at a particular layer of build of the integrated circuit chip). The kerf region is comprised of a pattern of opaque and clear sub-regions corresponding to features of an integrated circuit kerf (at a particular layer of build of the integrated circuit chip).

Kerfs comprise a dicing channel filled with structures that are used for physical and/or electrical image measurements, device parametric measurements and alignment marks (images that allow a current mask to be aligned to pattern on the wafer formed by an earlier used mask), alignment measurement structures, and other non-chip integrated circuit chip structures. Kerfs are also known in the art as streets or scribe lines.

In a photolithographic process of an integrated circuit manufacturing line, the pattern of opaque and clear sub-regions of the cell region will be transferred into a photoresist layer on a semiconductor wafer during fabrication of a level of an integrated circuit chip after exposure and development of the photoresist layer.

FIG. 1 is a plan view of an exemplary two dimensional multi-layer reticle layout 100 according to the present invention. In FIG. 1 a reserved for frame region 105 surrounds reserved cell regions 110A, 110B, 110C and 110D. In a completed multi-layer reticle (MLR), reserved cell regions 110A, 110B, 110C and 110D will include a respective cell 1, 2, 3 and 4 (each cell comprised of a chip region and a kerf region) or a fill cell (comprised of a dummy chip region and a dummy kerf region). Reserved for frame region 105 will be opaque. All reserved for cell regions 110A, 110B, 110C and 110D have the same width X and length Y. Layout 100 has two rows and two columns and is an R by C array with R and C both equal to 2. In the general case, R and C are independently positive integers equal to or greater than 2.

The term "cell" (without a qualifier) includes single or multi-chip cells used to define a layer of an integrated circuit chip. In the following descriptions, it should be understood that it is advantageous that all "cells" conform to the four criteria described infra. Note all cells on the MLR contain the same number of chips.

Figure 6:
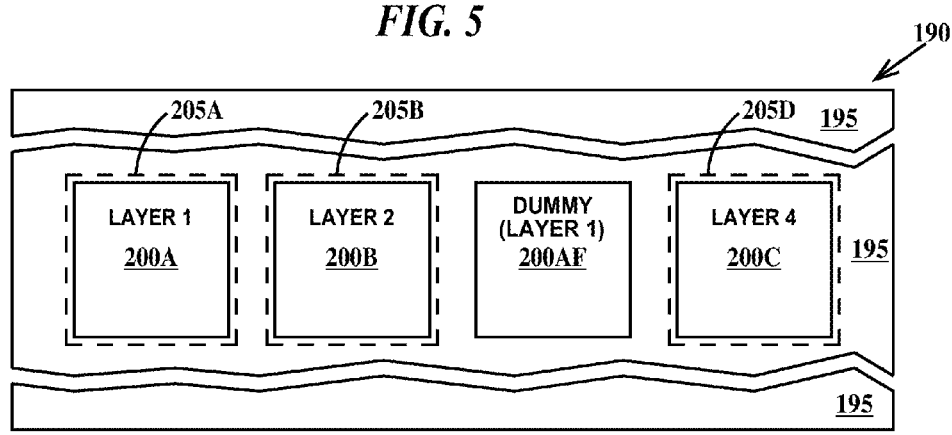
FIG. 6 is a top view of a second exemplary a multi-layer reticle using the one dimensional multi-layer reticle layout of FIG. 4 according to an embodiment of the present invention.

Reserved cell regions (for all embodiments of the present invention) define positions for predefined sequence of cells defining different layers of a same integrated circuit chip whether or not all of the cells are present on the reticle. In one example, the cell positions are predefined based on order of use in the integrated circuit fabrication process. For example in the sequence first wiring layer M1, second wiring layer M2, third wiring layer M3 and fourth wiring layer M4, cell position 1 is reserved for a cell defining the M1 layer, cell position 2 is reserved for a cell defining the M2 layer, cell position 3 is reserved for a cell defining the M3 layer and cell position 4 is reserved for a cell defining the M4 layer. In the reticle design there may be an "empty" cell position in which a "dummy cell" is placed so the physical reticle comprises cells and dummy cells. In certain embodiments, as illustrated in FIGS. 6 and 10, the procedure would be:

(1) for a sequence of possible wafer fabrication layers, each layer of the sequence of wafer fabrication layers defining a different but same type of fabrication level, reserving a corresponding array position of the array of cells.

(2) receiving data (which may be from an in-house or external customer) corresponding to two or more layers of the sequence of layers.

(3) using the data, generating cells corresponding to each layer of the two or more layers, the cells being a same mask type and a same contrast.

(4) placing the generated cells in the corresponding array positions.

(5) if there an empty array position between the placed cells, then placing a copy of a placed cell in the empty position.

There may be for example, four possible wiring layers in the sequence of possible wafer fabrication layers, but a particular integrated circuit design may only call out for three, so only three cells will be generated. If the "missing cell" is a between two placed cells, then the reticle will be "plugged" by insertion of a copy of one of the placed cells. In one example, of the placed cells, the cell having the lowest sequence position will be used.

It is advantageous that cells conform to the following criteria:
(1) They are the same mask type, e.g., a COG or PSM and if PSM, the same type of PSM.
(2) They are the same contrast, i.e., all positive contrast or negative contrast. In negative contrast, the photoresist pattern to be printed is defined by clear regions of the photomask. In positive contrast, the photoresist pattern to be printed is defined by opaque regions of the photomask.
(3) They require the same image size compensation.
(4) They are the same type of wafer fabrication layer, e.g., all metal layers (defining wires of an integrated circuit chip), all via layers (defining interconnections between wires in adjacent wiring levels) or all block layers (defining ion implantation regions).

FIG. 2 is a top view of a first exemplary a multi-layer reticle using the two dimensional multi-layer reticle layout of FIG. 1 according to an embodiment of the present invention. In FIG. 2, a MLR 115 includes an opaque frame 120 completely surrounding a first cell 125A, a second cell 125B, a third cell 125C and a fourth cell 125D. Each cell 125A, 125B, 125C and 125D have the same dimensions (i.e., X by Y as in FIG. 1). Each cell 125A, 125B, 125AF and 125D defines a different but same type layer (see infra) of an integrated circuit chip. An inspection window 130 includes all of cells 125A, 125B, 125C and 125D, all of frame 120 between cells 125A, 125B, 125C and 125D as well as a contiguous region of the frame between cells 125A, 125B, 125C and 125D and the edges 126A, 126B, 126C and 126D of MLR 115. Only inspection window 130 will be inspected for defects.

FIGS. 2A and 2B are top views of exemplary reticle cells according to embodiments of the present invention. In FIG. 2A, a cell 125A includes a chip region 130A and a kerf region 130B. In FIG. 2B, a cell 125B includes chip regions 130C and 130E and kerf regions 130C and 130F. Cell 125A is an example of a single chip cell and cell 125B is an example of a multi-chip cell. Cells 125A, 125B, 125C and 125D may be single or multi-chip cells, but must contain the same number of chip/kerf combinations.

FIG. 3 is a top view of a second exemplary a multi-layer reticle using the two dimensional multi-layer reticle layout of FIG. 1 according to an embodiment of the present invention. In FIG. 3, a MLR 135 includes an opaque frame 140 completely surrounding a first cell 145A, a second cell 145B, a dummy cell 145AF and a fourth cell 145D. Fill cell 145AF is not used to fabricate a wafer, but maintains uniform pattern density of the MLR. Each cell 145A, 145B, 145C and 125D have the same dimensions (i.e., X by Y as in FIG. 1). Each cell 145A, 145B, and 145D defines a different but same type layer of an integrated circuit chip. Dummy cell 145AF includes a second instance of cell 145A because there was no layer 3 cell data for the cell position reserved for a layer 3 cell on the reticle layout. An inspection window 150A includes all of cell 145A and a region of frame 140 surrounding cell 145A. An inspection window 150B includes all of cell 145B and a region of frame 140 surrounding cell 145B. An inspection window 150D includes all of cell 145D and a region of frame 140 surrounding cell 145D. Inspection windows 150A and 150B may be co-extensive between cells 145A and 145B or a region of frame 140 may intervene between inspection windows 150A and 150B as shown in FIG. 3. Inspection windows 150B and 150D may abut between cells 145B and 145D (a contiguous inspection window including cells 145A, 145B and 145D, regions of frame 140 surrounding cells 145A, 145B and 145D) or a region of frame 140 may intervene between inspection windows 150B and 150D as shown in FIG. 3. Only inspection windows 150A, 150B and 150D are inspected for defects. Dummy cell 145AF is not inspected for defects.

FIG. 4 is a plan view of a first exemplary one dimensional multi-layer reticle layout 155 according to the present invention. In FIG. 4 a reserved for frame region 160 surrounds reserved cell regions 165A, 165B, 165C and 165D. In a completed multi-layer reticle (MLR), reserved for cell regions will include a cell (each cell comprised of a chip region and a kerf region) or a fill cell (comprised of a dummy chip region and a dummy kerf region). The reserved for frame region will be opaque. All reserved for cell regions 165A, 165B, 165C and 165D have the same width X and length Y. Layout 155 has one row and four columns and is an R by C array with R equal to 1 and C equal to 4. In the general case, R equals 1 and C is a positive integer equal to or greater than 3.

Figure 5:
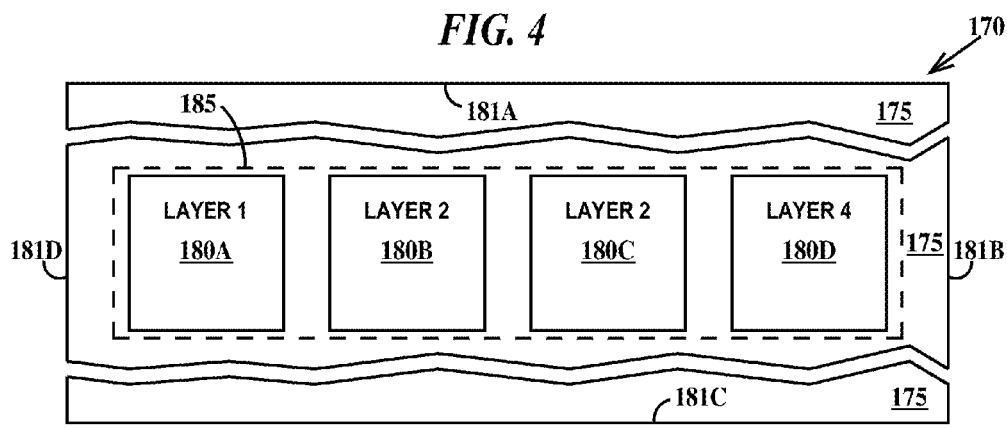
FIG. 5 is a top view of a first exemplary a multi-layer reticle using the one dimensional multi-layer reticle layout of FIG. 4 according to an embodiment of the present invention.

FIG. 5 is a top view of a first exemplary a multi-layer reticle using the one dimensional multi-layer reticle layout of FIG. 4 according to an embodiment of the present invention. In FIG. 5, a MLR 170 includes an opaque frame 175 completely surrounding a first cell 180A, a second cell 180B, a third cell 180C and a fourth cell 180D. Each cell 180A, 180B, 180C and 180D have the same dimensions (i.e., X by Y as in FIG. 4). Each cell 180A, 180B, 180C and 180D defines a different but same type layer of an integrated circuit chip. An inspection window 185 includes all of cells 180A, 180B, 180C and 180D, all of frame 175 between cells 180A, 180B, 180C and 180D as well as a contiguous region of the frame between cells.180A, 180B, 180C and 180D and edges 181A, 181B, 181C and 181D of MLR 170. Only inspection window 185 will be inspected for defects.

FIG. 6 is a top view of a second exemplary a multi-layer reticle using the one dimensional multi-layer reticle layout of FIG. 4 according to an embodiment of the present invention. In FIG. 6, a MLR 190 includes an opaque frame 195 completely surrounding a first cell 200A, a second cell 200B, a dummy cell 200AF and a fourth cell 200D. Dummy cell 200AF is not a cell in the first or last position of the row of cells of the row of cells consisting of cells 200A, 200B, 200AF and 200D. Each cell 200A, 200B, 200AF and 125D have the same dimensions (i.e., X by Y as in FIG. 4). Each cell 200A, 200B, and 200D defines a different but same type layer of an integrated circuit chip. Dummy cell 200AF includes a second instance of cell 200A because there was no layer 3 cell data for the cell position reserved for a layer 3 cell on the reticle layout. An inspection window 205A includes all of cell 200A and a region of frame 195 surrounding cell 200A. An inspection window 205B includes all of cell 200B and a region of frame 195 surrounding cell 200B. An inspection window 205D includes all of cell 200D and a region of frame 195 surrounding cell 200D. Inspection windows 205A and 205B may be co-extensive between cells 200A and 200B or a region of frame 195 may intervene between inspection windows 205A and 205B as shown in FIG. 6. Inspection windows 205B and 205D may abut between cells 200B and 200D or a region of frame 195 may intervene between inspection windows 205B and 205D as shown in FIG. 6. Only inspection windows 205A, 205B and 205D are inspected for defects. Dummy cell 200AF is not inspected for defects.

Figure 7:
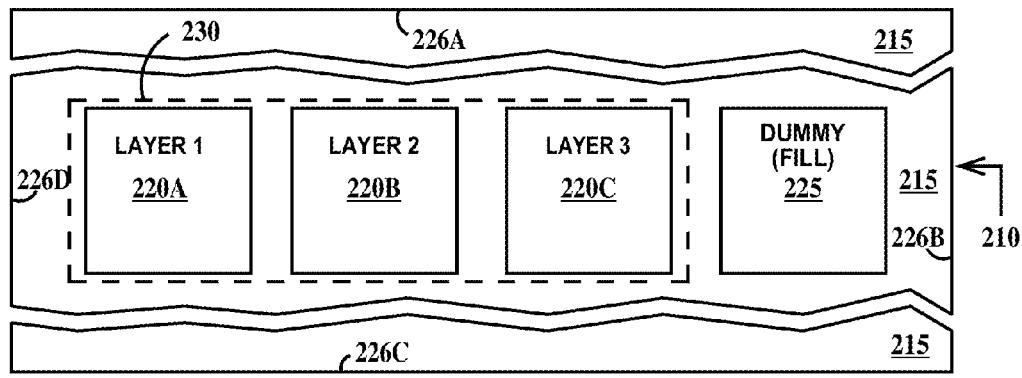
FIG. 7 is a top view of a third exemplary a multi-layer reticle using the one dimensional multi-layer reticle layout of FIG. 4 according to an embodiment of the present invention.

FIG. 7 is a top view of a third exemplary a multi-layer reticle using the one dimensional multi-layer reticle layout of FIG. 4 according to an embodiment of the present invention. In FIG. 7, a MLR 210 includes an opaque frame 215 completely surrounding a first cell 220A, a second cell 220B, a third cell 220C and a dummy cell 225. In one example, dummy cell 225 is an opaque cell having no designed clear regions and thus does not define a pattern of any layer of an integrated circuit. In another example, dummy cell 225 is a cell with a pattern of clear and opaque regions that do not define a pattern of any layer of an integrated circuit. Each cell 220A, 220B and 220C have the same dimensions (i.e., X by Y as in FIG. 4). Each cell 220A, 220B and 220C defines a different but same type layer of an integrated circuit chip. Opaque cell 225 is placed where a layer 4 cell would have been placed because there was no layer 4 cell data for the cell position reserved for a layer 4 cell on the reticle layout. A shrunken (compared to inspection window 185 of FIG. 5) inspection window 215 includes all of cells 220A, 220B and 220C, all of frame 215 between cells 220A, 220B and 220C, and a contiguous region of the frame between cells 220A, 220B and 220C and edges 226A, 226B, 226C and between cell 220C and opaque fill cell 225. Shrunken inspection window 230 does not include opaque fill cell 225. Only shrunken inspection window 230 is inspected for defects. Dummy cell 225 is not inspected for defects. Note a shrunken inspection window is only possible when all the cells to be inspected for defects are adjacent to each other.

In FIG. 7, dummy cell 225 is positioned in the last position of the row of cells (between cell 220C and edge 226B of MLR 210). In another example, the dummy cell is positioned in the first position of the row of cells (between cell 220B and edge 226D of MLR 210). In a further example, there may be two or more dummy cells adjacent to each other with one of the cells positioned in the first or last position of the row. In a still further example, there may be a dummy cell in both the first and last row positions. See FIG. 7A, wherein C1, C2, C3 and C4 denote cells in respective cell positions 1, 2, 3 and 4 and F denotes an opaque filled cell position.

Figure 8:
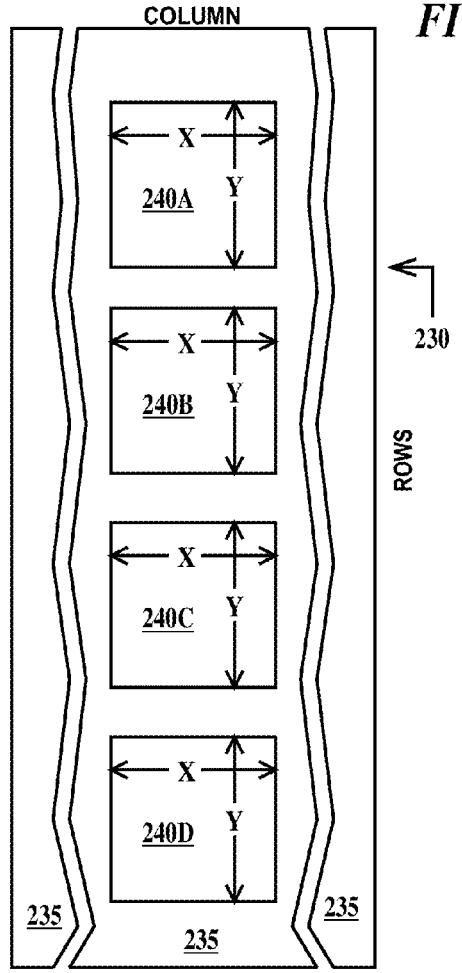
FIG. 8 is a plan view of a second exemplary one dimensional multi-layer reticle layout according to the present invention.

FIG. 8 is a plan view of a first exemplary one dimensional multi-layer reticle layout 230 according to the present invention. In FIG. 8 a reserved for frame region 235 surrounds reserved cell regions 240A, 240B, 240C and 240D. In a completed multi-layer reticle (MLR), reserved for cell regions will include a cell (each cell comprised of a chip region and a kerf region) or a fill cell (comprised of a dummy chip region and a dummy kerf region). The reserved for frame region will be opaque. All reserved for cell regions 240A, 240B, 240C and 240D have the same width X and length Y. Layout 230 has four rows and one column and is an R by C array with R equal to 4 and C equal to 4. In the general case, R is a positive integer equal to or greater than 3 and C and equals 1.

Figure 9:
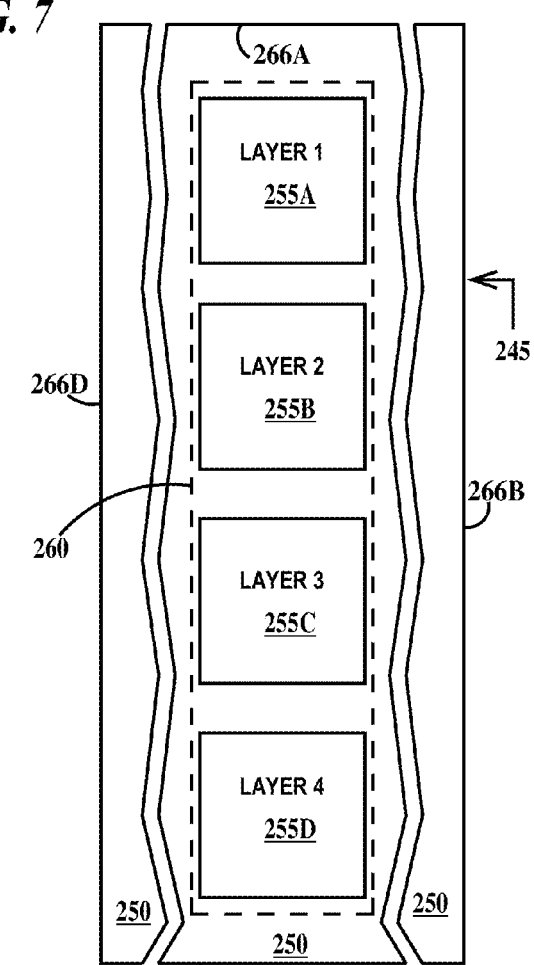
FIG. 9 is a top view of a first exemplary a multi-layer reticle using the one dimensional multi-layer reticle layout of FIG. 8 according to an embodiment of the present invention.

FIG. 9 is a top view of a first exemplary a multi-layer reticle using the one dimensional multi-layer reticle layout of FIG. 8 according to an embodiment of the present invention. In FIG. 9, a MLR 245 includes an opaque frame 250 completely surrounding a first cell 255A, a second cell 255B, a third cell 255C and a fourth cell 255D. Each cell 255A, 255B, 255C and 255D have the same dimensions (i.e., X by Y as in FIG. 8). Each cell 255A, 255B, 255C and 255D defines a different but same type layer of an integrated circuit chip. An inspection window 260 includes all of cells 255A, 255B, 255C and 255D, all of frame 250 between cells 255A, 255B, 255C and 255D as well as a contiguous region of the frame between cells 255A, 255B, 255C and 255D and edges 266A, 266B, 266C and 266D of MLR 245. Only inspection window 260 will be inspected for defects.

FIG. 10 is a top view of a second exemplary a multi-layer reticle using the one dimensional multi-layer reticle layout of FIG. 8 according to an embodiment of the present invention. In FIG. 10, a MLR 265 includes an opaque frame 270 completely surrounding a first cell 275A, a second cell 275B, a dummy cell 275AF and a fourth cell 275D. Each cell 275A, 275B, 275AF and 125D have the same dimensions (i.e., X by Y as in FIG. 8). Each cell 275A, 275B, and 275D defines a different but same type layer of an integrated circuit chip. Dummy cell 275AF includes a second instance of cell 275A because there was no layer 3 cell data for the cell position reserved for a layer 3 cell on the reticle layout. Dummy cell 275AF is not a cell located at the top or bottom position of the column of cells consisting of cells 275A, 275B, 275AF and 275D. An inspection window 280A includes all of cell 275A and a region of frame 140 surrounding cell 275A. An inspection window 280B includes all of cell 275B and a region of frame 270 surrounding cell 275B. An inspection window 280D includes all of cell 275D and a region of frame 270 surrounding cell 275D. Inspection windows 280A and 280B may be co-extensive between cells 275A and 275B or a region of frame 270 may intervene between inspection windows 280A and 280B as shown in FIG. 10. Inspection windows 280B and 280D may abut between cells 275B and 275D or a region of frame 195 may intervene between inspection windows 280B and 280D as shown in FIG. 10. Only inspection windows 280A, 280B and 280D are inspected for defects. Dummy cell 275A is not inspected for defects.

FIG. 11 is a top view of a third exemplary a multi-layer reticle using the one dimensional multi-layer reticle layout of FIG. 8 according to an embodiment of the present invention. In FIG. 11, a MLR 285 includes an opaque frame 290 completely surrounding a first cell 295A, a second cell 295B, a third cell 295C and a dummy cell 300. In one example, dummy cell 300 is an opaque cell having no designed clear regions and thus does not define a pattern of any layer of an integrated circuit. In another example, dummy cell 300 is a cell with a pattern of clear and opaque regions that do not define a pattern of any layer of an integrated circuit. Each cell 295A, 295B and 295C have the same dimensions (i.e., X by Y as in FIG. 8). Each cell 295A, 295B and 295C defines a different but same type layer of an integrated circuit chip. Dummy cell 300 is placed where a layer 4 cell would have been placed because there was no layer 4 cell data for the cell position reserved for a layer 4 cell on the reticle layout. A shrunken (compared to inspection window 260 of FIG. 9) inspection window 305 includes all of cells 295A, 295B and 295C, all of frame 295 between cells 290A, 290B, 290C, and a contiguous region of frame 290 between cells 295A, 295B and 295C and edges 310A, 310B, 3101C and between cell 295C and dummy cell 300. Shrunken inspection window 305 does not include dummy cell 300. Only shrunken inspection window 305 is inspected for defects. Dummy cell 300 is not inspected for defects. Note a shrunken inspection window is only possible when all the cells to be inspected for defects are adjacent to each other.

In FIG. 11, dummy cell 300 is positioned in the bottom position of the column of cells (between cell 295C and edge 310C of MLR 285). In another example, the dummy cell is positioned in the top position of the row of cells (between cell 220B and edge 226D of MLR 210). In a further example, there may be two or more dummy cells adjacent to each other with one of the cells positioned in the top or bottom position of the column. In a still further example, there may be a dummy cell in both the top and bottom column positions. See FIG. 11A, wherein C1, C2, C3 and C4 denote cells in respective cell positions 1, 2, 3 and 4 and F denotes an opaque filled cell position.

Figure 12:
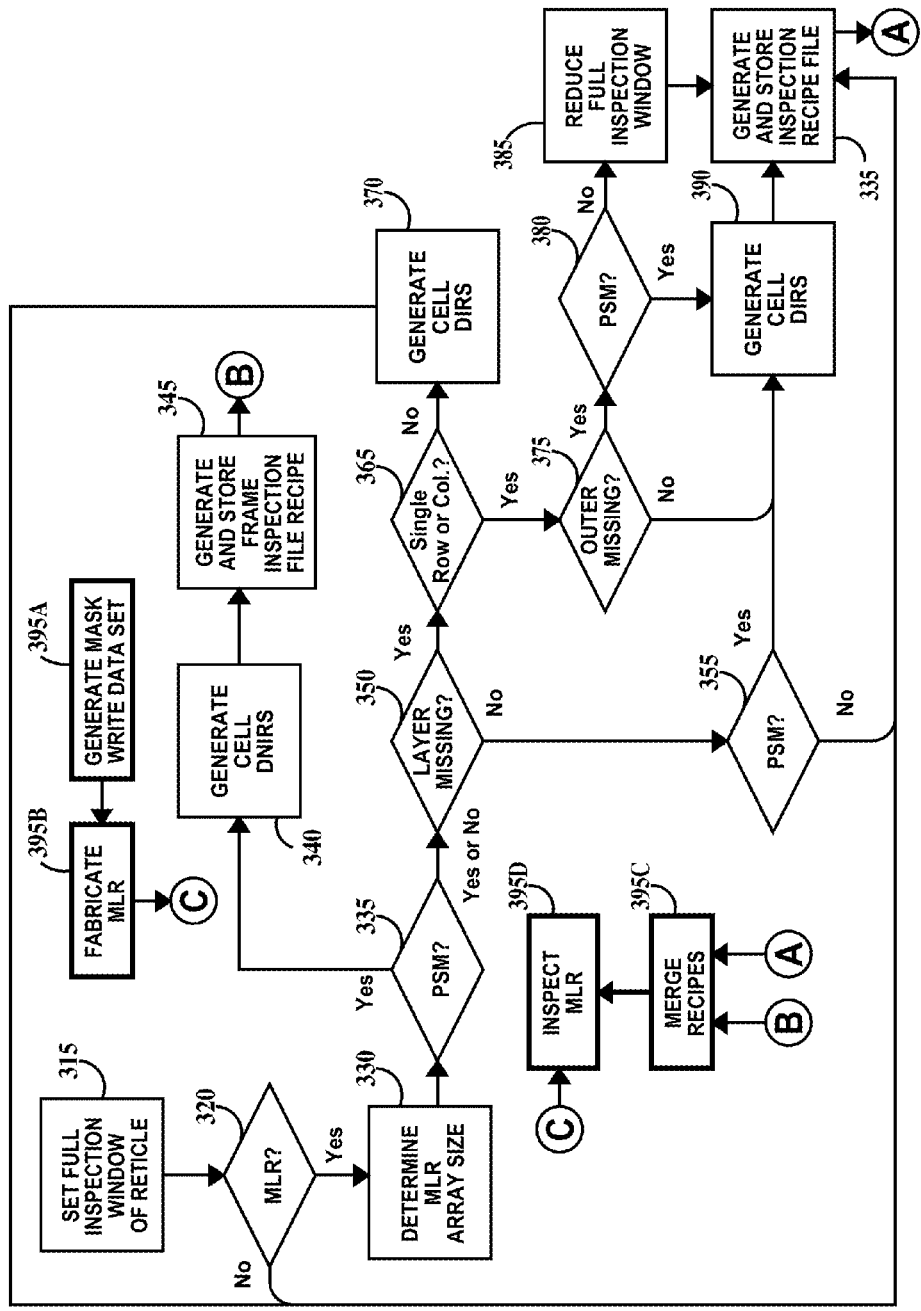
FIG. 12 is flowchart of a method of inspecting multi-layer reticles according to an embodiment of the present invention.

FIG. 12 is flowchart of a method of inspecting multi-layer reticles according to an embodiment of the present invention. In step 315, the full inspection window of reticle is set based on reticle layout in a relational database described infra. For an MLR this is inspection window 130 of FIG. 2, inspection window 185 of FIG. 5 or inspection window 260 of FIG. 9. Next, in step 320 it is determined if the reticle is an MLR or not. If the reticle is not an MLR then the method proceeds to step 325 where an inspection recipe file (i.e., instructions for a mask inspection tool) is generated and stored. If the reticle is not an MLR then the method proceeds to step 330.

In step 330, the MLR array size (values of R and C) are determined. Next in step 345 it is determined if the MLR is a PSM. If the mask is a phase shift mask the method precedes to both steps 340 and 350. For a non-PSM the method proceeds to step 350 and not 340. This is because the inspection of the frame of a PSM is different from the inspection of the cells of a PSM. The inspection of a frame of a non-PSM is basically the same as for a cell of a non-PSM. In step 340, cell do-not-inspect regions (DNIRs) of the reticle are generated and in step 345 a frame inspection recipe file is generated and stored. A DNIR defines a region of the full inspection window that will not be inspected for defects. Cell DNIRs of step 345 include all of the cell regions of the MLR PSM within the full inspection window. These DNIRs are used only for generating the frame inspection window from the full inspection window.

Returning to step 350, in step 350 it determined if layer design data for any cell is missing. Design data is data describing the pattern of clear and opaque regions to be formed on a cell of the MLR. This data is found in the relational database. If no design data is missing then the method proceeds to step 355 where it is again determined if the MLR is a PSM. If the MLR is not a PSM then the method proceeds to step 325.

Returning to step 350, if layer design data for any cell is missing then the method proceeds to step 365. In step 365 it is determined if the MLR is a single row array (R equal to one and C equal to or greater than two) or single column array (R equal to or greater than two and C equal to one). If the MLR is not a single row or single column array then the method proceeds to step 370 where cell do-inspect regions (DIRs) are generated. These cell DIRs exclude fill cells (e.g., fill cells 145AF of FIG. 3). This avoids wasting time inspecting cells that will not be used in fabricating wafers. From step 370, the method proceeds to step 325.

Returning to step 365, if the MLR is a single row or single column array in step 375 it is determined if design data for an outer cell is missing (e.g., a cell closet to an edge of the reticle). If the missing design data is not from an outer cell then the method proceeds to step 360. If the missing design data is from an outer cell then the method proceeds to step 380 where it is again determined if the MLR is a PSM. If the MLR is not a PSM the method proceeds to step 385. In step 385, the full inspection window is reduced to generate a shrunken inspection window as illustrated, for example, by window 230 of FIG. 7 and window 305 of FIG. 11. If in step 390. the MLR is a PSM the method proceeds to step 390 where cell DIRs are generated and then proceeds to step 335.

Four additional steps are illustrated in FIG. 12. In step 395A a mask fabrication data set is generated from cell layer design data, kerf design data, and data describing a mask reticle layout (e.g., layout 100 of FIG. 1, layout 155 of FIG. 4, and layout 230 of FIG. 8). The layer design data, kerf design data, and data describing a mask reticle layout are stored in the relational database. In step 395B, a reticle is fabricated using the mask fabrication data. In step 395C, the inspection recipe from step 325 is merged with the frame inspection recipe from step 345 (if a frame inspection recipe exists) and in step 395D a physical MLR is inspected for defects using the inspection recipe from step 395C. Defects include, but are not limited to unwanted holes in opaque regions, unwanted opaque spots in clear regions, unwanted clear notches in opaque regions and unwanted opaque extensions into clear regions. Steps 315 through 390 do not require an actual MLR to have been fabricated, only that the data used by step 395A exist.

Figure 13:
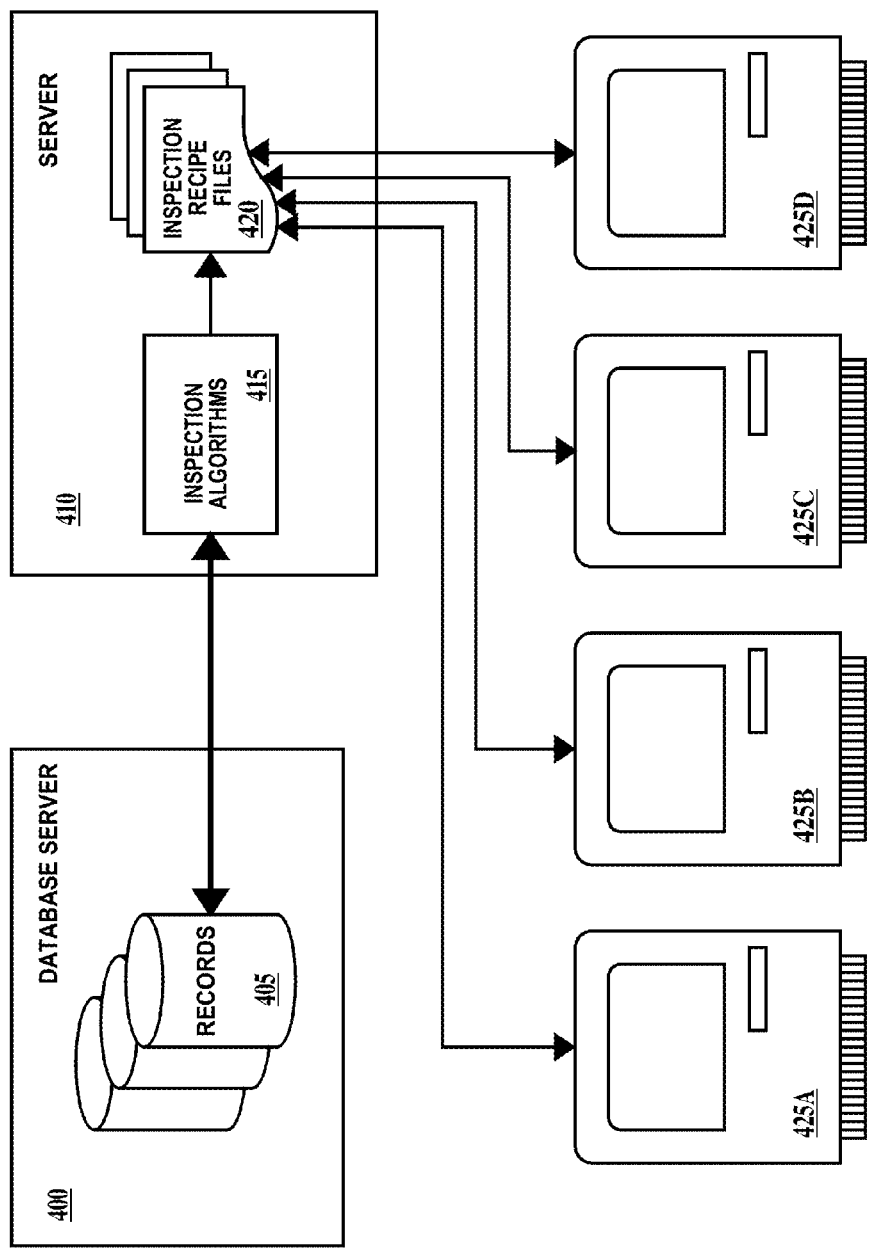
FIG. 13 is a schematic diagram of a physical implementation of a system for implementing multi-later reticle inspection according to an embodiment of the present invention.

FIG. 13 is a schematic diagram of a physical implementation of a system for implementing multi-later reticle inspection according to an embodiment of the present invention. In FIG. 13, a database server 400 includes a relational database 405. A host computer (e.g., a large general purpose computer) uses the data contained in tables on the relational database to generate a mask fabrication data set used to "write" the pattern of opaque and clear regions of the MLR. In an alternate embodiment, database server 400 may be replaced with a host computer containing relational database 405. One example of a host computer is a multiple virtual storage (MVS) host where the host may be an IBM system 370, IBM system/390 or other large computer system.

A relational database is an integrated collection of logically related records or files consolidated into a common pool that provides data for one or more multiple uses. The related records are linked" to each other by keys. A relational database provides a declarative method for specifying data and queries. It is stated directly what information the database contains and what information is wanted from it. The database management system software takes care of describing data structures for storing the data and retrieval procedures for getting queries answered. Examples of relational databases include but are not limited to DB2 (IBM), Oracle Database and Microsoft SQL Server.

Returning to FIG. 13, database server 400 is linked to a server 410 (e.g., a fast general purpose computer). Server 410 includes inspection algorithms 415 in the form of executable code that generates inspection recipe files 420 from data on relational database 405. Server 410 is linked to mask defect inspection tools 425A, 425B, 425C, and 425D. While four mask defect inspection tools are illustrated, there may be a few as one or more than four. Examples of mask defect inspection tools include but are not limited to KLA 300 series, KLA SLF series, KLA 500 series and KLA SL3 series tools. Mask defect inspection tools 25A, 425B, 425C, and 425D request and receive mask inspection recipes from server 410.

Figure 14:
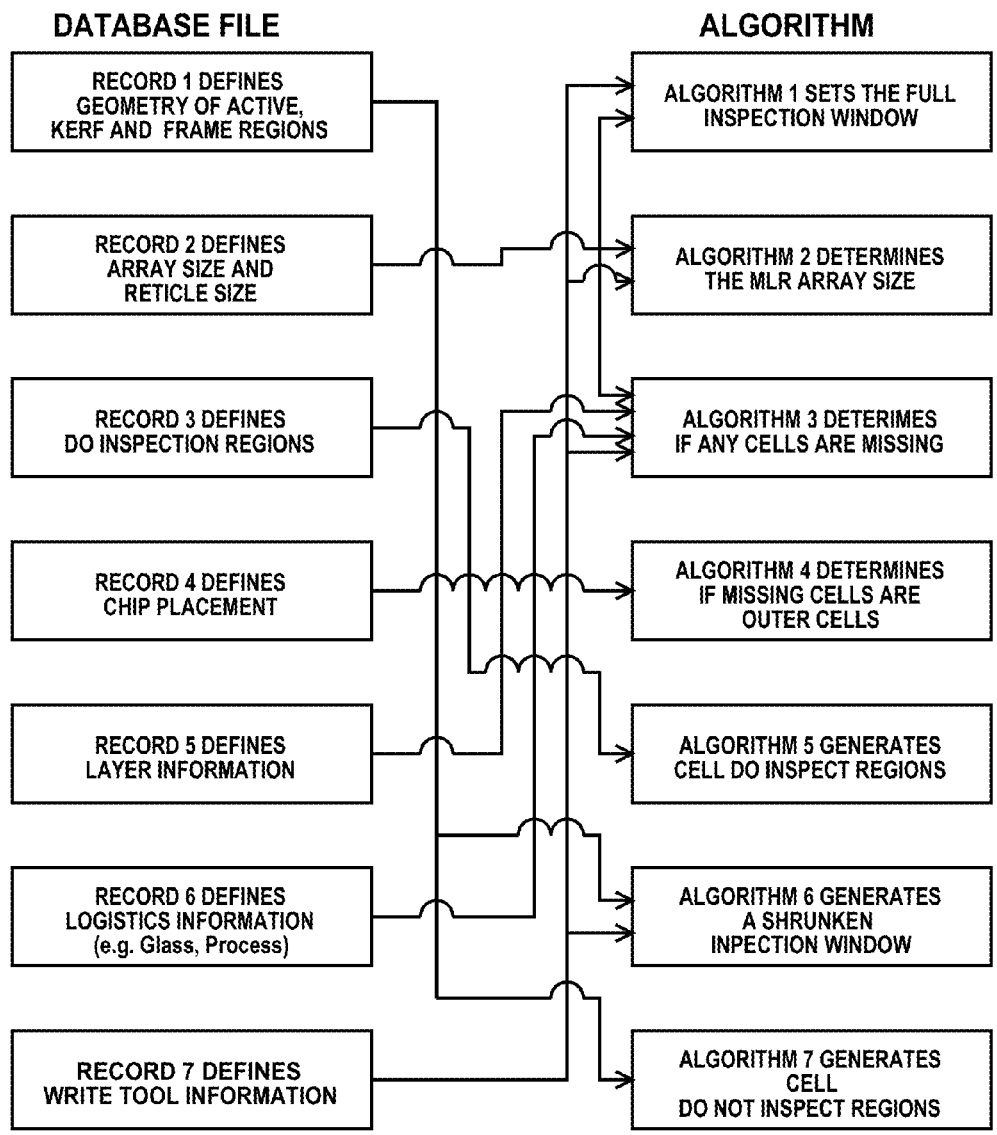
FIG. 14 is diagram illustrating the algorithms of the steps of FIG. 12 and information in a relational database according to an embodiment of the present invention.

FIG. 14 is diagram illustrating the algorithms of the steps of FIG. 12 and information in a relational database according to an embodiment of the present invention. In FIG. 14, a first set of records of relational base 405 define the geometry of active, kerf and frame regions of the MLR. A second set of records of relational base 405 define the size of the array (e.g., defines the values of R and C) and the size of the reticle. A third set of records of relational base 405 define DIRs. A fourth set of records of relational base 405 define the placement of place of chip regions within the cells. A fifth set of records of relational base 405 defines cell layer information. A sixth set of records of relational base 405 defines logistical information such as glass and process. A seventh set of records of relational base 405 defines mask write tool information.

In FIG. 14 a first algorithm (step 315 of FIG. 12) sets a full inspection window. A second algorithm (step 330 of FIG. 12) determines the array size. A third algorithm (step 350 of FIG. 12) determines if any layers are missing. A fourth algorithm (step 375 of FIG. 12) determines if the missing cells are outer cells. A fifth algorithm (steps 370 and 390 of FIG. 12) creates cell do-inspect regions. A sixth algorithm (step 345 of FIG. 12) generates a shrunken inspection window by reducing the full inspection window. A seventh algorithm (step 340 of FIG. 12) sets cells DNIRs.

The first algorithm uses the second and seventh set of records. The second algorithm uses the second and seventh set of records. The third algorithm uses the second, fifth, sixth and seventh set of records. The fourth algorithm uses the fourth set of records. The fifth algorithm uses the third set of records. The sixth algorithm uses the first and seventh set of records. The seventh algorithm uses the first set of records.

Figure 15:
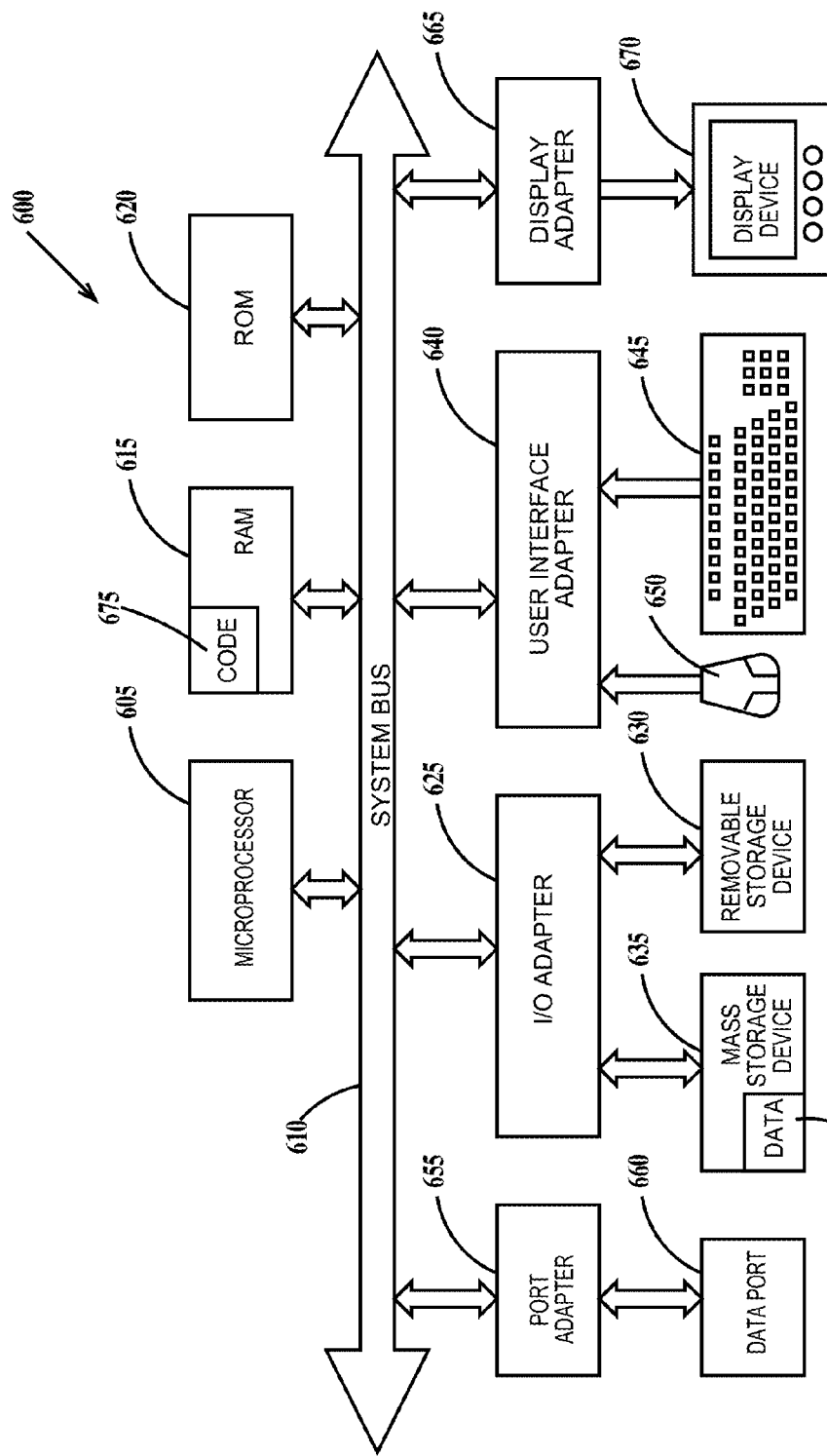
FIG. 15 is a schematic block diagram of a computer portion of a tester for practicing the embodiments of the present invention.

FIG. 15 is a schematic block diagram of a computer portion of an inspection system tester for practicing the embodiments of the present invention. Generally, the method described herein with respect to a method for inspecting multi-layer reticles is practiced with a system comprising one or more computers linked to one or more inspection system/tools and the methods described supra in the flow diagram of FIG. 12 and the algorithms of FIG. 14 may be coded as a set of instructions on removable or hard media for use by the computer. Though separate computers, both the data base server 400 (or a host computer, e.g., MVS host computer) and server 410 of FIG. 13 may be represented by FIG. 15.

FIG. 15 is a schematic block diagram of a general-purpose computer. In FIG. 15, computer system 600 has at least one microprocessor or central processing unit (CPU) 605. CPU 605 is interconnected via a system bus 610 to a random access memory (RAM) 615, a read-only memory (ROM) 620, an input/output (I/O) adapter 625 for a connecting a removable data and/or program storage device 630 and a mass data and/or program storage device 635, a user interface adapter 640 for connecting a keyboard 645 and a mouse 650, a port adapter 655 for connecting a data port 660 and a display adapter 665 for connecting a display device 670.

ROM 620 contains the basic operating system for computer system 600. The operating system may alternatively reside in RAM 615 or elsewhere as is known in the art. Examples of removable data and/or program storage device 630 include magnetic media such as floppy drives and tape drives and optical media such as CD ROM drives. Examples of mass data and/or program storage device 635 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 645 and mouse 650, other user input devices such as trackballs, writing tablets, pressure pads, microphones, light pens and position-sensing screen displays may be connected to user interface 640. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 630, fed through data port 660 or typed in using keyboard 645.

Thus, the embodiments of the present invention provide a method and system for inspecting multi-layer reticles that mitigate the deficiencies and limitations described hereinabove.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    selecting a multi-layer reticle having an array of cells arranged in R rows and C columns;
    defining a full inspection region that includes all cells of said array of cells;
    using a computer, generating an inspection recipe based on the algorithm: when R is equal to one and C is an integer equal to or greater than two and a cell of said array of cells is a dummy cell that does not define a layer of an integrated circuit chip and said dummy cell is in a first or last position of a row of said array of cells or when C is equal to one and R is an integer equal to or greater than two and a cell of said array of cells is a dummy cell that does not define a layer of an integrated circuit chip and said dummy cell is not in a top or bottom position of a column of said array of cells, then reducing said full inspection region to generate a shrunken inspection region that does not include said dummy cell; and
    inspecting said shrunken inspection region for defects using a mask inspection tool running said inspection recipe.

2. The method of claim 1, wherein other than said dummy cell, each cell of said array of cells includes a pattern defining a different layer of a same layer type of a same integrated circuit chip.

3. The method of claim 2, wherein said dummy cell is opaque and has no designed clear regions.

4. The method of claim 1, said algorithm including:
    when R is equal to one and C is an integer equal to or greater than three and at least one cell of said array of cells is a dummy cell which is copy of another cell of said array and said dummy cell is not located in a first or last position of a row of said array of cells then generating a do-inspect region for each cell of said array of cells that is not a dummy cell; or when C is equal to one and R is an integer equal to or greater than three and at least one cell of said array of cells is a dummy cell which is copy of another cell of said array and said dummy cell is not located is in a first or last position of a column of said array of cells then generating a do-inspect region for each cell of said array of cells that is not a dummy cell; and
    said inspection recipe including inspecting said do-inspect regions for defects.

5. The method of claim 4, wherein other than said dummy cell, each cell of said array of cells includes a pattern defining a different layer of a same layer type of a same integrated circuit chip.

6. The method of claim 1, said algorithm including:
    when R and C are independently integers equal to or greater than two and at least one cell of said array of cells is a dummy cell which is copy of another cell of said array then defining a do-inspect region for each cell of said array of cells that is not a dummy cell; and
    said inspection recipe including inspecting said do-inspect regions for defects.

7. The method of claim 6, wherein other than said dummy cell, each cell of said array of cells includes a pattern defining a different layer of a same layer type of a same integrated circuit chip.

8. A method comprising:
    selecting a multi-layer reticle having an array of cells arranged in R rows and C columns;
    defining a full inspection region that includes all cells of said array of cells;
    determining the value of R and C;
    using a computer, generating an inspection recipe based on the algorithm:
        if all cells of said all cells of said array of cells define different layers of an integrated circuit, then inspecting said full inspection region for defects; or
        if at least one cell of said array of cells is a dummy cell either does not define a layer of said integrated circuit or is a copy of another cell of said array of cells and both R and C are independently equal to or greater than two, then generating do-inspect regions for each cell of said array that is not a dummy cell, then inspecting said do-inspect regions for defects; or
        if at least one cell of said array of cells is a dummy cell that either does not define a layer of said integrated circuit or is a copy of another cell of said array of cells and either R or C but not both are equal to one, then generating do-inspect regions for each cell of said array that is not a dummy cell, then inspecting said do-inspect regions or generating a shrunken inspection region that includes all cells of said array or cells that are not dummy cells for defects, then inspecting said shrunken inspection region; and
    inspecting said multi-layer reticle for defects using a mask inspection tool running said inspection recipe.

9. The method of claim 8, wherein dummy cells that are not copies of other cells of said array are opaque cells having no designed clear regions.

10. The method of claim 8, wherein:
    said multi-layer reticle includes an opaque frame around and between each cell of said array of cells;
    said full inspection region includes regions of said frame that surround each cell of said array in said full inspection region,
    said do-inspect regions include regions of said frame that surround each cell of said array in said do-inspect regions; and
    said shrunken inspection regions include regions of said frame that surround each cell of said array in said shrunken inspection region.

11. The method of claim 8, wherein said multi-layer reticle is a phase shift mask and includes an opaque frame around and between each cell of said array of cells and said inspection recipe including:
    a cell inspection recipe that includes only said do-inspect regions; and
    a frame inspection recipe that includes only regions of said frame.

12. The method of claim 8, said algorithm including, when either R or C but not both are equal to one:
    if (i) at least one cell of said array of cells is a dummy cell that either does not define a layer of said integrated circuit or is a copy of another cell of said array of cells and (ii) R is equal to one and (iii) said dummy cell is not located in a first or last position of a row of said array of cells, then generating said do-inspect regions for each cell of said array that is not a dummy cell and inspecting said do-inspect regions for defects; or
    if (iv) at least one cell of said array of cells is a dummy cell that either does not define a layer of said integrated circuit or is a copy of another cell of said array of cells and (v) C is equal to one and (vi) said dummy cell is not located in a first or last position of a column of said array of cells, then generating said do-inspect regions for each cell of said array that is not a dummy cell and inspecting said do-inspect regions for defects; or
    if (vii) at least one cell of said array of cells is a dummy cell that either does not define a layer of said integrated circuit or is a copy of another cell of said array of cells and (viii) C is equal to one and (ix) said dummy cell is located in a first or last position of a column of said array of cells, then reducing said full inspection region to generate said shrunken inspection region and then inspecting said shrunken inspection region for defects; or if (x) at least one cell of said array of cells is a dummy cell that either does not define a layer of said integrated circuit or is a copy of another cell of said array of cells and (xi) C is equal to one and (xii) said dummy cell is located in a first or last position of a column of said array of cells, then reducing said full inspection region to said shrunken inspection region.

13. The method of claim 8, further including:

for a sequence of possible wafer fabrication layers, each layer of said sequence of wafer fabrication layers defining a different but same type of fabrication level, reserving a corresponding array position of said array of cells;

receiving data corresponding to two or more layers of said sequence of layers;

using said data, generating cells corresponding to each layer of said two or more layers, said cells being a same mask type and a same contrast;

placing said generated cells in said corresponding array positions; and if there an empty array position between said placed cells, then placing a copy of a placed cell in said empty position.

14. A computer system, comprising a processor, an address/data bus coupled to said processor, and a computer-readable memory unit coupled to communicate with said processor, said memory unit containing instructions that when executed by the processor implement a method of generating an inspection recipe file, said method comprising the computer implemented steps of:

based on records in a database describing a design of a multi-layer reticle having an array of cells arranged in R rows and C columns, selecting a multi-layer reticle having an array of cells arranged in R rows and C columns;

defining a full inspection region that includes all cells of said array of cells;

determining the value of R and C; and if all cells of said all cells of said array of cells define different layers of an integrated circuit, then inspecting said full inspection region for defects; or if at least one cell of said array of cells is a dummy cell either does not define a layer of said integrated circuit or is a copy of another cell of said array of cells and both R and C are independently equal to or greater than two, then generating do-inspect regions for each cell of said array that is not a dummy cell and inspecting said do-inspect regions for defects; or if at least one cell of said array of cells is a dummy cell that either does not define a layer of said integrated circuit or is a copy of another cell of said array of cells and either R or C but not both are equal to one, then generating do-inspect regions for each cell of said array that is not a dummy cell and inspecting said do-inspect regions or generating a shrunken inspection region that includes all cells of said array or cells that are not dummy cells for defects.

15. The computer system of claim 14, wherein said records indicate that other than said dummy cell, each cell of said array of cells includes a pattern defining a different layer of a same layer type of a same integrated circuit chip.

16. The computer system of claim 15, wherein said records indicate that said dummy cell is opaque and has no designed clear regions.

17. The computer system of claim 14, the method further including:

when R is equal to one and C is an integer equal to or greater than three and at least one cell of said array of cells is a dummy cell which is copy of another cell of said array and said dummy cell is not located in a first or last position of a row of said array of cells generating a do-inspect region for each cell of said array of cells that is not a dummy cell and then generating a first alternative inspection recipe file useable by said mask inspection tool, said first alternative inspection recipe file including instructions for inspecting said do-inspect regions for defects; or when C is equal to one and R is an integer equal to or greater than three and at least one cell of said array of cells is a dummy cell which is copy of another cell of said array and said dummy cell is not located is in a first or last position of a column of said array of cells generating a do-inspect region for each cell of said array of cells that is not a dummy cell and then generating a second alternative inspection recipe file useable by said mask inspection tool, said second alternative inspection recipe file including instructions for inspecting said do-inspect regions for defects.

18. The computer system of claim 17, wherein said records indicate that other than said dummy cell, each cell of said array of cells includes a pattern defining a different layer of a same layer type of a same integrated circuit chip.

19. The computer system of claim 14, the method further including:

when R and C are independently integers equal to or greater than two and at least one cell of said array of cells is a dummy cell which is copy of another cell of said array then generating a do-inspect region for each cell of said array of cells that is not a dummy cell and then generating an alternative inspection recipe file useable by said mask inspection tool, said alternative inspection recipe file including instructions for inspecting said do-inspect regions for defects.

20. The computer system of claim 19, wherein said records indicate that other than said dummy cell, each cell of said array of cells includes a pattern defining a different layer of a same layer type of a same integrated circuit.

21. A computer system, comprising a processor, an address/data bus coupled to said processor, and a computer-readable memory unit coupled to communicate with said processor, said memory unit containing instructions that when executed by the processor implement a method of generating an inspection recipe file, said method comprising the computer implemented steps of:

based on records in a database describing a design of a multi-layer reticle having an array of cells arranged in R rows and C columns, each cell of said array of cells independently either defining a layer of an integrated circuit or not defining a layer of said integrated circuit chip:

defining a full inspection region that includes all cells of said array of cells;

determining the value of R and C; and if all cells of said all cells of said array of cells define different layers of an integrated circuit, then generating an inspection recipe file useable by a mask defect inspection tool, said inspection recipe file including instructions for inspecting said full inspection region for defects; or if at least one cell of said array of cells is a dummy cell that either does not define a layer of said integrated circuit or is a copy of another cell of said array of cells and both R and C are independently equal to or greater than two, then generating do-inspect regions for each cell of said array that is not a dummy cell; and then generating a first alternative inspection recipe file useable by said mask defect inspection tool, said first alternative inspection recipe file including instructions for inspecting said do-inspect regions; or if at least one cell of said array of cells is a dummy cell that either does not define a layer of said integrated circuit or is a copy of another cell of said array of cells and either R or C but not both are equal to one, then generating do-inspect or a shrunken inspection region (s) that includes all cells of said array or cells that are not dummy cells, and then generating a second alternative inspection recipe file useable by said mask defect inspection tool, said second alternative inspection recipe file including instructions for inspecting said do-inspect or said shrunken inspection region(s).

22. The computer system of claim 21, wherein said records indicate that dummy cells that are not copies of other cells of said array are opaque cells having no designed clear regions.

23. The computer system of claim 21, wherein:
said multi-layer reticle includes an opaque frame around and between each cell of said array of cells;
said full inspection region includes regions of said frame that surround each cell of said array in said full inspection region,
said do-inspect regions include regions of said frame that surround each cell of said array in said do-inspect regions; and
said shrunken inspection regions include regions of said frame that surround each cell of said array in said shrunken inspection region.

24. The computer system of claim 21, wherein said records indicate that said multi-layer reticle is a phase shift mask and includes an opaque frame around and between each cell of said array of cells and the method further including:
generating a cell inspection recipe file useable by said mask inspection tool, said cell inspection recipe including instruction for inspecting only said do-inspect regions; and
generating a frame inspection recipe useable by said mask inspection tool, said frame inspection recipe including instruction for inspecting only regions of said frame.

25. The computer system of claim 21, the method further including, when either R or C but not both are equal to one:

if (i) at least one cell of said array of cells is a dummy cell that either does not define a layer of said integrated circuit or is a copy of another cell of said array of cells and (ii) R is equal to one and (iii) said dummy cell is not located in a first or last position of a row of said array of cells, then generating said do-inspect regions for each cell of said array that is not a dummy cell, said second alterative inspection recipe file including instructions for inspecting said do-inspect regions; or if (iv) at least one cell of said array of cells is a dummy cell that either does not define a layer of said integrated circuit or is a copy of another cell of said array of cells and (v) C is equal to one and (vi) said dummy cell is not located in a first or last position of a column of said array of cells, then generating said do-inspect regions for each cell of said array that is not a dummy cell, said second alterative inspection recipe file including instructions for inspecting said do-inspect regions; or if (vii) at least one cell of said array of cells is a dummy cell that either does not define a layer of said integrated circuit or is a copy of another cell of said array of cells and (viii) C is equal to one and (ix) said dummy cell is located in a first or last position of a column of said array of cells, then reducing said full inspection region to generate said shrunken inspection region, said second alterative inspection recipe file including instructions for inspecting said shrunken inspection region for defects; or if (x) at least one cell of said array of cells is a dummy cell that either does not define a layer of said integrated circuit or is a copy of another cell of said array of cells and (xi) C is equal to one and (xii) said dummy cell is located in a first or last position of a column of said array of cells, then reducing said full inspection region to said shrunken inspection region, said second alterative inspection recipe file including instructions for inspecting said shrunken inspection region for defects.

* * * * *